United States Patent
Mo et al.

[11] Patent Number: 5,889,794
[45] Date of Patent: Mar. 30, 1999

[54] TWO-LEVEL ERROR CORRECTION ENCODER

[75] Inventors: Shih Mo, Milpitas; Stanley Chang, Pleasanton, both of Calif.; Lih-Jyh Weng, Needham; Ba-Zhong Shen, Shrewsbury, both of Mass.

[73] Assignee: Quantum Corporation, Milpitas, Calif.

[21] Appl. No.: 940,187

[22] Filed: Sep. 30, 1997

[51] Int. Cl.⁶ ................................................. H03M 13/00
[52] U.S. Cl. .................... 371/37.11; 371/40.1; 371/37; 371/38; 371/37.1; 371/42
[58] Field of Search ................. 371/37.11, 40.1, 371/37, 38, 37.1, 42

[56] References Cited

U.S. PATENT DOCUMENTS

| | | |
|---|---|---|
| 4,856,003 | 8/1989 | Weng ........................................ 371/37 |
| 5,428,630 | 6/1995 | Weng et al. ........................... 371/40.1 |

*Primary Examiner*—Reba I. Elmore
*Assistant Examiner*—McDieunel Marc
*Attorney, Agent, or Firm*—Patricia A. Sheehan; Debra A. Chun

[57] ABSTRACT

A two-level error correction encoder encodes m-bit data symbols in a first level of encoding in accordance with a distance d ECC over $GF(2^{m+i})$ to produce (m+i)-bit ECC redundancy symbols and, during a second level of encoding, both modifies the set of ECC redundancy symbols, as necessary, to set i selected bits in each symbol in a predetermined truncation pattern and appends to the set of ECC symbols one or more pseudo redundancy symbols. The encoder includes d–1 Galois Field multipliers, and d–1 associated redundancy-symbol registers and an ECC symbol modifier lookup table that has stored therein information that the encoder uses during the second level of encoding. After the first level of encoding, the d–1 registers contain the (m+i)-bit ECC redundancy symbols. These symbols are used to enter the look-up table and select information that the encoder then encodes along with the ECC redundancy symbols, to produce the modified ECC redundancy symbols and append thereto one or more pseudo redundancy symbols. As the ECC redundancy symbols are modified, the encoding system removes them from the two-level encoder and appends them to the data. The last symbol(s) removed from the encoder and appended to the data are the one or more pseudo redundancy symbols. The system then truncates the i-bit pattern from each of the redundancy symbols to produce, at the end of the two-level encoding operation, a data code word that includes the m-bit data symbols, the m-bit modified ECC redundancy symbols and one or more m-bit pseudo redundancy symbols.

16 Claims, 2 Drawing Sheets

TWO-LEVEL ERROR CORRECTION ENCODER

RELATED APPLICATIONS

This application is related to co-pending applications Ser. No. 08/749,235, entitled Modified Reed Solomon Code Selection and Encoding System; and Ser. No. 08/786,894, entitled Modified Reed-Solomon Error Correction System Using (w+i+1)-Bit Representations of Symbols of $GF(2^{w+i})$, both of which are incorporated herein by reference.

FIELD OF INVENTION

The invention relates generally to error correcting systems and, more particularly, to error correcting systems for use with modified Reed Solomon codes.

BACKGROUND OF THE INVENTION

The importance of error correction coding of data in digital computer systems has increased greatly as the density of the data recorded on mass storage media, more particularly disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is written to a disk, it is mathematically encoded to form ECC redundancy symbols. The ECC redundancy symbols are then appended to the data string to form code words—data symbols plus ECC redundancy symbols—and the code words are written to or stored on the disks. When data is to be read from the disks, the code words containing the data symbols to be read are retrieved from the disks and mathematically decoded. During decoding any errors in the data are detected and, if possible, corrected through manipulation of the ECC redundancy symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, Error Correction Codes]. To correct multiple errors in strings of data symbols, Reed-Solomon codes efficiently and effectively utilize the various mathematical properties of sets of symbols known as Galois Fields, represented "GF (Pq)", where "P" is a prime number and "q" can be thought of as the number of digits, base P, in each element or symbol in the field. "P" usually has the value 2 in digital computer applications and, therefore, "q" is the number of bits in each symbol.

The number of symbols which an ECC based on a Reed-Solomon code can effectively encode and correct, or "protect," is limited by the size of the Galois Field selected, i.e. Pq symbols, and the maximum number of errors which the code is to be capable of correcting. The maximum length of a cyclic Reed-Solomon code word for GF (Pq) is Pq-1 symbols. Thus the maximum number of data symbols which can be protected by the ECC, that is, included in the code word, is Pq-1 symbols minus "e," where "e" is the number of ECC redundancy symbols. The larger the Galois Field, the longer the code word, and the more data the ECC can protect for a given maximum number of errors to be corrected.

While larger Galois Fields could be used to protect larger strings of data symbols, using Galois Fields that result in code word symbols that have a number of bits that is greater than eight and not a multiplier of eight, complicates the circuitry of the system. The remainder of the system operates with 8-bit symbols or bytes, or symbols that are multiples of eight bits. Accordingly, if the ECC uses symbols that are longer than eight bits, the system must include an interface to translate the symbols between the 8-bit symbols used by the remainder of the system and the longer symbols used by the ECC circuitry.

An ECC based on $GF(2^8)$ can protect a string of up to 253 8-bit data symbols or "data bytes" against a single error, if two 8-bit ECC redundancy symbols are appended to the data, making the code word 255 or $2^8-1$ bytes long. If the ECC is to correct more than one error, more ECC redundancy symbols, two for each additional error to be corrected, must be used in the code word. This means that fewer data bytes can be protected for a given length of code word.

Information is often stored on magnetic disks in sectors which are 512 or 576 bytes in length. Therefore, ECC's which are based on $GF(2^8)$ must be interleaved some number of times to protect an entire 512 or 576 byte sector. Interleaving effectively splits the string of data symbols into several smaller segments, i.e., segments of less than 255 symbols each, and treats each segment as a stream of data symbols to be encoded. The benefits of interleaving are that it permits a larger number of data symbols to be encoded by a given code, and that it effectively separates bursts of errors by encoding adjacent data symbols in different code words. However, in the systems that use interleaving there is a chance that the error correction actually introduces errors by modifying the data symbols to produce valid, but incorrect, code words. To prevent this "miscorrection" a separate error detection code, or cross-check, is typically used to ensure that the modifications made using the interleaved error correction code produce the correct data symbols.

In prior systems 8-bit-symbol error detection codes ("EDCs") over $GF(2^8)$ or 16-bit-symbol error detection codes over $GF(2^{16})$ are used. The 8-bit-symbol codes are easy to implement but are relatively weak, with maximum distances of only two. Alternatively, the more powerful 16-bit-symbol codes are complex to implement, requiring manipulation of 16-bit symbols.

An error detection code based on $GF(2^{10})$ has sufficient code word length, i.e. $2^{10}-1$ or 1023 symbols per code word, to readily cross check an entire sector. However, the encoding and decoding of the 10-bit symbols used in a $GF(2^{10})$ code present certain problems.

As discussed above, computer transmission and storage hardware is set up for bytes, i.e. 8-bit symbols, or symbols whose lengths are some multiple of 8-bits, such as 16-bit symbols. Thus they are, in general, not arranged for manipulation of 10-bit symbols. Therefore, if a $GF(2^{10})$ EDC is to be used, the information has to be translated back and forth between bytes and 10-bit symbols, first for encoding as 10-bit symbols, next for transmission and storage as bytes, and finally for decoding as 10-bit symbols. The requirement of translating between bytes and 10-bit symbols at both the encoder and the decoder adds the complexity of another step to the EDC cross check process. Further, since the data are modulated by modulation codes that are based on 8-bit symbols, using 10-bit symbols for the EDC may result in more errors since a modulation code symbol may be demodulated into more than one EDC symbol. Thus, an erroneous demodulation of one modulation code word symbol may result in two erroneous EDC code word symbols.

One solution is to generate a code word in $GF(2^{10})$ to protect up to 1023 bytes (data, ECC redundancy symbols)

and yet use 8-bit symbols, or bytes, as the EDC symbols. In a prior system that uses an ECC over $GF(2^{10})$, one or more predetermined pseudo data bytes are appended to the data bytes and the string comprised of the data bytes plus the pseudo data bytes is encoded to produce the desired number of 10-bit ECC redundancy symbols. Then, two selected bits in each of the 10-bit ECC redundancy symbols are compared to a known 2-bit pattern, e.g. "00." If the selected two bits in each of the 10-bit ECC redundancy symbols are the same as the 2-bit pattern, the selected bits of the ECC redundancy symbols are ignored or truncated and the remaining 8 bits of each of the ECC redundancy symbols are concatenated with the data bytes and the appended pseudo data bytes to form the data code word. The code word bytes can later be decoded, and any error correction performed, by appending the known 2-bit truncation pattern as necessary for Galois Field addition and/or multiplication.

If any of the selected bits in any of the ECC 10-bit symbols are not the same as the corresponding bits of the truncation pattern, the ECC symbols and the appended pseudo data bytes are modified in a second encoding operation to produce a modified code word consisting of the data bytes, the modified pseudo data bytes and 10-bit ECC redundancy symbols with the selected bits set in the truncation pattern. The selected bits, which are now the same as the known truncation pattern, are then ignored and the remaining 8 bits of each of the ECC redundancy symbols and the modified pseudo data bytes are stored along with the data bytes as the data code word. The modified pseudo data bytes and the remaining 8 bits of the ECC redundancy symbols contain all the information necessary to allow the decoding and error correction of the data code word.

The prior system is discussed in U.S. Pat. No. 4,856,003 entitled Error Correction Code Encoder, which is assigned to a common assignee. As discussed in detail below, we have made improvements to the prior system. As discussed in U.S. patent application Ser. No. 08/786,894, entitled Modified Reed-Solomon Error Correction System Using (w+i+1)-Bit Representations of Symbols of $GF(2^{w+i})$, which is incorporated herein by reference, we have devised an error correction system that includes in the data code word additional pseudo redundancy symbols, instead of including therein the pseudo data bytes. This allows the system, for example, to manipulate the data in a conventional manner as 10-bit symbols (with appended bits set in the truncation pattern) to produce the 10-bit ECC redundancy symbols.

The system discussed in the above-referenced patent application next modifies the ECC redundancy symbols, as necessary, by combining them with an ECC modifier code word, to set the appropriate two bits in each ECC redundancy symbol in the truncation pattern. The ECC modifier code word also appends to the ECC symbols the pseudo redundancy symbols that contain the information necessary for decoding. The system then truncates the 2-bit pattern from both the modified ECC redundancy symbols and the pseudo redundancy symbols and appends them as 8-bit symbols to the 8-bit data symbols to form the data code word. This speeds up the encoding process over that used in the prior system, since the system is not required to modify pseudo data symbols before appending the ECC redundancy symbols to the data symbols.

We have also further improved the system by including therein an encoder that produces the data code word redundancy symbols, that is, both the modified ECC redundancy symbols and the pseudo redundancy symbols, in a single encoding operation.

SUMMARY OF THE INVENTION

An encoding system incorporating the invention includes a two-level error correction encoder that, during a first level of encoding, encodes m-bit data symbols in accordance with a distance d ECC over $GF(2^{m+i})$ to produce (m+i)-bit ECC redundancy symbols and, during a second level of encoding, both modifies the set of ECC redundancy symbols, as necessary, to set i selected bits in each symbol in a predetermined truncation pattern and appends to the set of ECC symbols one or more pseudo redundancy symbols. The encoder includes d−1 Galois Field multipliers, and d−1 associated redundancy-symbol registers and an ECC symbol modifier lookup table that has stored therein information that the encoder uses during the second level of encoding. After the first level of encoding, the d−1 registers contain the (m+i)-bit ECC redundancy symbols. These symbols are used to enter the look-up table and select information that the encoder then encodes along with the ECC symbols, to produce the modified ECC redundancy symbols and append thereto one or more pseudo redundancy symbols.

As the ECC redundancy symbols are modified, the encoding system removes them from the two-level encoder and appends them to the data. The last symbol(s) removed from the encoder and appended to the data are the one or more pseudo redundancy symbols. The system then truncates the i-bit pattern from each of the redundancy symbols to produce, at the end of the two-level encoding operation, a data code word that includes the m-bit data symbols, the m-bit modified ECC redundancy symbols and one or more m-bit pseudo redundancy symbols.

As discussed below, the two-level encoder may encode the data over $GF(2^{m+i})$ to produce (m+i+1)-bit ECC symbols, which it then modifies to store as m-bit symbols. The use of (m+i+1)-bit symbols in the encoder simplifies some of the encoding operations, and thus, the encoder hardware.

BRIEF DESCRIPTION OF THE DRAWINGS

The invention description below refers to the accompanying drawings, of which.

DETAILED DESCRIPTION OF AN ILLUSTRATIVE EMBODIMENT

All mathematical operations discussed below are Galois Field operations. We discuss in Sections 1 and 2 systems that produce one pseudo redundancy symbol. Specifically, in section 1 we discuss encoding over $GF(2^{m+i})$ using (m+i)-bit symbols and in Section 2 encoding over $GF(2^{m+i})$ using (m+i+1)-bit symbols. In Section 3 we discuss systems that produce more than one pseudo redundancy symbol.

1. Encoding using (m+i)-bit symbols

Figure 1:
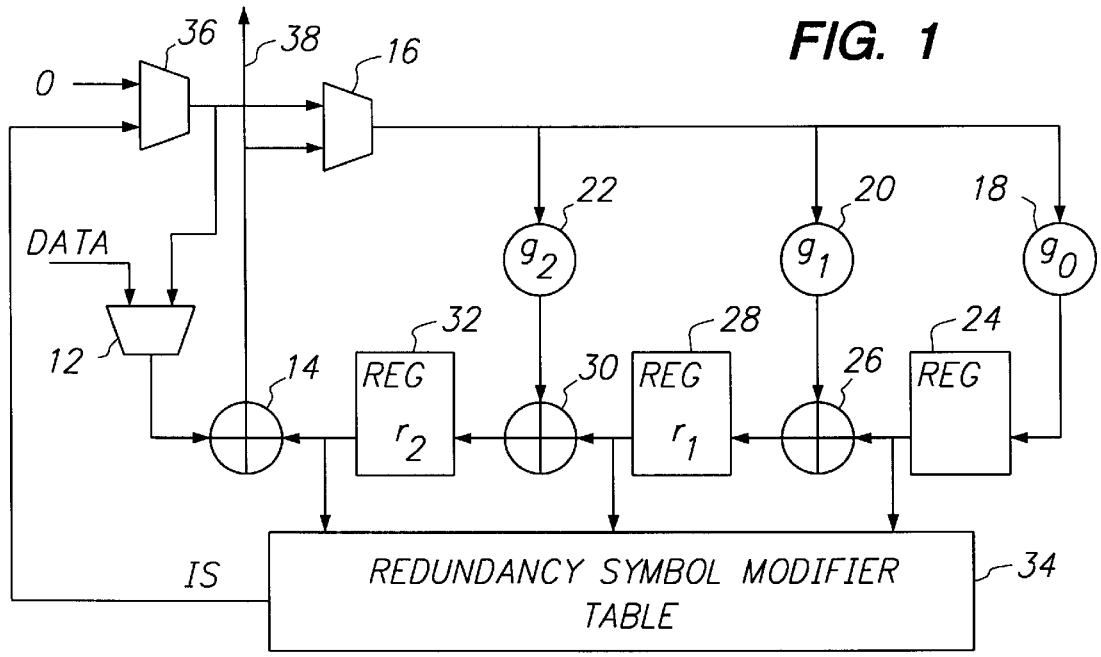
FIG. 1 is a functional block diagram of an encoding system that uses (m+i)-bit symbols and is constructed in accordance with the invention.

Referring now to FIG. 1, an encoding system 8 includes a two-level encoder 10 that during a first level of encoding encodes m-bit data symbols over $GF(2^{m+i})$ in accordance with a generator polynomial $$g(x)=x^{d-1}+g_{d-2}x^{d-2}+\ldots+g_1x+g_0$$

where d is the code distance. The result of the encoding is d−1 (m+i)-bit ECC redundancy symbols. The encoder 10, as discussed in more detail below, divides the data by the generator polynomial and produces the ECC redundancy symbols as a remainder.

The operations of the encoder 10 will be explained below with reference to the encoding of 8-bit data symbols over $GF(2^{10})$ in accordance with a generator polynomial $$g(x)=x^3+g_2x^2+g_1x+g_0.$$

Before an 8-bit data symbol is applied to the encoder 10, two bits that are set in a predetermined truncation pattern are appended to the symbol. The 10-bit data symbols are then applied serially to the encoder through a multiplexer 12 and an adder 14. The adder 14 adds the data symbol to the contents of a register 32, and applies the sum through a multiplexer 16 to Galois Field multipliers 18, 20 and 22. The Galois Field multipliers multiply the sum by the coefficients of the generator polynomial. Specifically, the Galois Field multiplier 18 multiplies the sum by the coefficient $g_0$, and the product is then used to update a register 24. The Galois Field multiplier 20 multiplies the sum by the coefficient $g_1$, and the product is added to the previous contents of the register 24 in an adder 26. The sum from adder 26 is then used to update a register 28. The Galois Field multiplier 22 multiplies the sum from adder 14 by the coefficient $g_2$, and the product is added, in adder 30, to the previous contents of the register 28. This sum then used to update the register 32. As each data symbol is applied to the encoder, it is encoded in the same manner. After all the data symbols are applied to the encoder, the registers 24, 28 and 32 contain the 10-bit ECC redundancy symbols.

In order to store the 10-bit ECC redundancy symbols as 8-bit symbols, the ECC redundancy symbols are manipulated in a second level of encoding to set two selected bits in each symbol in the predetermined 2-bit truncation pattern. These two selected bits can then be ignored, or truncated, and the ECC redundancy symbols treated as 8-bit symbols.

In order to preserve the information that is necessary for the decoding of the modified ECC redundancy symbols, the system appends to them one or more 10-bit pseudo redundancy symbols, which also have the two selected bits set in the predetermined pattern. These redundancy symbols can then be treated as 8-bit symbols by ignoring or truncating the selected bits.

A data code word with m-bit symbols is formed from the data symbols, the m-bit modified ECC redundancy symbols and the m-bit pseudo redundancy symbols. This data code word includes all the information that is necessary to decode the code word in a conventional manner as 10-bit symbols, each with an appended 2-bit truncation pattern.

The number of pseudo redundancy symbols included in the data code word depends on the number of ECC redundancy symbols, which, in turn, depends on the code distance. The number R of pseudo redundancy symbols is calculated as $$R = \left\lceil \frac{i*deg(g(x))}{m} \right\rceil$$

where "deg (g(x))" is the degree of the generator polynomial g(x) and [ ]represents the ceiling function. In the example, R=1.

For the second level of encoding the selected bits of the ECC symbols are used to enter a redundancy symbol modifier table 34. The information selected by these bits is then encoded, to modify the contents of the registers 24, 28 and 32, that is, to modify the ECC redundancy symbols, and append thereto the R pseudo redundancy symbols. The contents of the table 34 will be discussed in more detail below with reference to FIGS. 2 and 3.

The information retrieved from the table 34, which consists of a 10-bit information symbol, is supplied to a multiplexer 36 that, in turn, supplies the information symbol to both the multiplexer 12 and the multiplexer 16.

The multiplexer 12 passes the information symbol to the adder 14, which adds it to the contents of register 32. This sum is then removed from the encoder on line 38 as a first modified ECC redundancy symbol. The multiplexer 16 passes the information symbol to the Galois Field multipliers 18, 20 and 22, which multiply the information symbol by the coefficients of the generator polynomial. The product of the information symbol and the coefficient $g_0$ updates register 24. The adder 26 adds the previous contents of the register 24 to the product of the information symbol and the coefficient $g_1$. The sum then updates the register 28. The adder 30 adds the previous contents of the register 28 to the product of the information symbol and the coefficient $g_2$, and the sum then updates the register 32. After the information symbol is encoded, the registers 24, 28 and 32 contain the remaining modified ECC symbols and the pseudo redundancy Symbol. The contents of the registers can thus be read in parallel. Alternatively, the redundancy symbols can be removed serially from the encoder 10 in three "counts," where a count is a series of operations that results in the updating of the registers 24, 28 and 32.

For the next count, the multiplexer 36 passes an all-zero symbol to the multiplexers 12 and 16. The contents of the register 32 are added, in adder 14, to the all zero symbol passed by multiplexer 12, and the sum, which is the second modified ECC symbol, is removed from the encoder on line 38. At the same time, the multiplexer 16 passes the all-zero symbol to the Galois Field multipliers 18, 20 and 22. The products, which are all-zero symbols, are then added respectively to the contents of the registers 24 and 28 by adders 26 and 30. The contents of the registers 24 and 28, which are unaffected by the addition of the all-zero symbols, are thus passed respectively from register 24 to register 28 through adder 26 and from register 28 to register 32 through adder 30. The zero-valued product produced by Galois Field multiplier 18 updates the register 24 to all zeros.

For the next count another all-zero symbol is applied to the multiplexers 12 and 16 through the multiplexer 36. The multiplexer 12 passes the all-zero symbol to the adder 14, which adds it to the contents of register 32. This sum is then removed from the encoder on line 38, as the third modified ECC symbol. The multiplexer 16 passes the all-zero symbol to the Galois Field multipliers, which each produce zero-valued products. The product produced by Galois Field multiplier 18 updates the register 24, and the previous contents of that register, which is an all-zero symbol, is added to the zero-valued product produced by Galois Field multiplier 20. This sum, which is also an all-zero symbol updates the register 28. The adder 30 adds the all-zero product produced by Galois Field multiplier 22 to the previous contents of the register 28, and the sum updates the register 32. The register 32 now contains the pseudo redundancy symbol.

A third all-zero symbol is applied to the encoder through multiplexers 36, 12 and 16. The adder 14 adds the all-zero symbol to the contents of register 32, and the sum is removed from the encoder on line 38. The all-zero symbol is also applied, through multiplexer 16, to the Galois Field multipliers, all of which produce all-zero products. These products are used to update the registers 24, 28 and 32, through the adders 26 and 30, as appropriate. Each updated register now contains an all-zero symbol, and the encoder 10 is ready to encode a next series of data symbols.

Set forth below is a chart of the contents of the registers 24, 28 and 32 during the second level of encoding. The chart also includes the symbols that are removed from the encoder on line 38. The chart is arranged by "counts," which are a series of operations required to modify the contents of the registers. In the chart, the information symbol is represented by "IS," and the contents of the registers 24, 28 and 32 at the end of the encoding of the data are represented, respectively, by "$r_0$", "$r_1$" and "$r_2$."

| COUNT | OUT | Reg. 32 | Reg. 28 | Reg. 24 |
|---|---|---|---|---|
| 0 | — | $r_2$ | $r_1$ | $r_0$ |
| 1 | IS+$r_2$ | (IS*$g_2$)+$r_1$ | (IS*$g_1$)+$r_0$ | IS*$g_0$ |
| 2 | (IS*$g_2$)+$r_1$ | (IS*$g_1$)+$r_0$ | IS*$g_0$ | 0 |
| 3 | (IS*$g_1$)+$r_0$ | IS*$g_0$ | 0 | 0 |
| 4 | IS*$g_0$ | 0 | 0 | 0 | where "*" represents multiplication.

Figure 2:
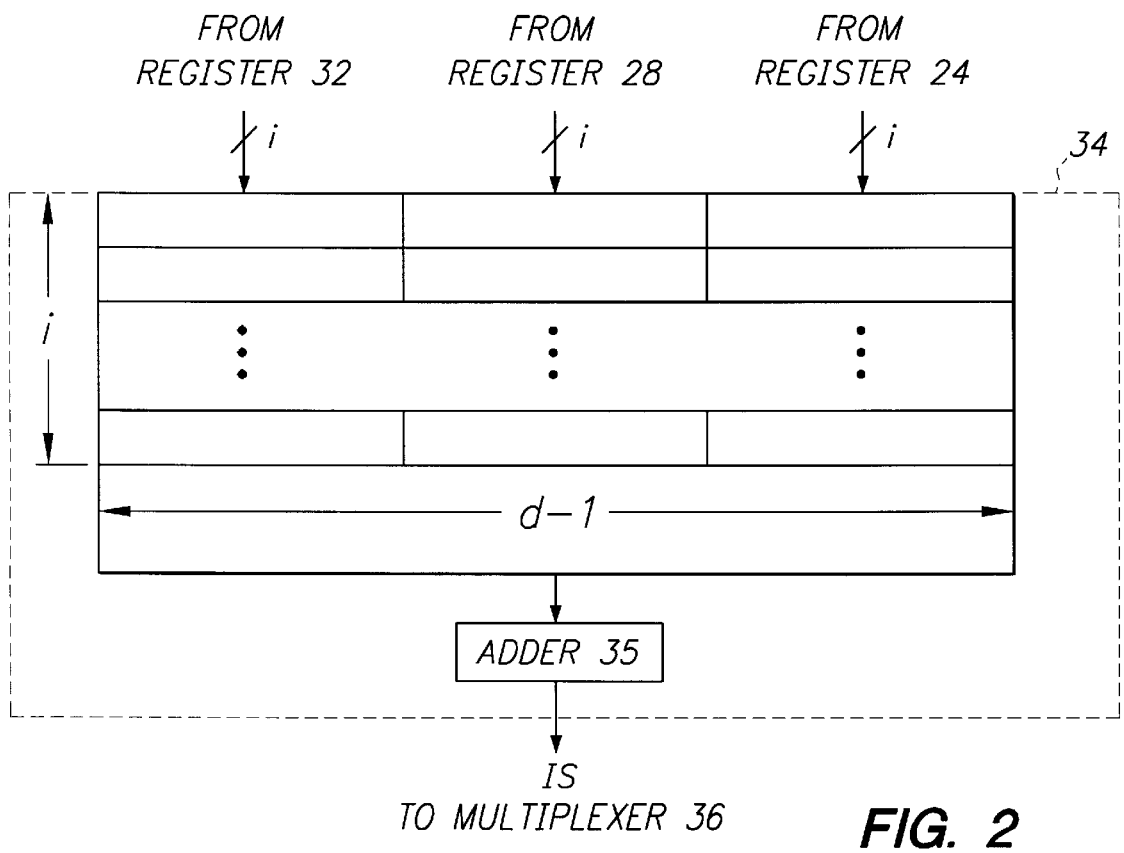
FIG. 2 is a functional block diagram of a look-up table that is included in the encoding system of FIG. 1.

Referring now to FIG. 2, the ECC modifier look-up table 34 contains information that is combined in an adder 35 to produce the information symbol that is used in the second level of encoding. The table 34 is entered using the selected bits from each of the registers. The bits from a given ECC symbol address one table location for each selected bit that is not set in the truncation pattern. The contents of the selected table locations are then summed in the adder, to produce the information symbol.

As discussed above the 10-bit ECC redundancy symbols are modified to set the two selected bits in each ECC redundancy symbol in the predetermined truncation pattern. In the example, the selected bits are the two highest order bits, and the truncation pattern is "00." For each ECC redundancy symbol the two bits may either be set in the truncation pattern or one or both of the bits may be non-zero. Accordingly, each ECC redundancy symbol has associated with it information that can be used to separately modify each of the selected two bits, to change each bit from a 1 to a 0. If both of the selected bits of one of the ECC symbols are non-zero, the information associated with each bit is retrieved from the table 34. Similarly, the information associated with setting the selected bits of the remaining ECC redundancy symbols in the truncation pattern is also retrieved from the table. The retrieved information is then summed in an adder 35 to produce the information symbol that, when encoded with the ECC redundancy symbols, properly modifies each of the ECC redundancy symbols and appends to them the appropriate pseudo redundancy symbol.

As is explained in the patent application Ser. No. 08/749,235, entitled modified Reed Solomon Code Selection and Encoding System, the i-bit truncation pattern may be any i-bit pattern. The ECC modifier table entries associated with each of the 10-bit ECC redundancy symbols are based on the truncation pattern, the positions of the selected bits, and the ECC. Using the techniques discussed in the application, the information required for the table 34 can be determined.

In the above-referenced patent application, the data symbols are encoded in a first encoding operation to produce a preliminary data code word that includes the data symbols and the (m+i)-bit ECC redundancy symbols. Then, an ECC modifier code word associated with the various ECC redundancy symbols is produced, and this code word is combined with the preliminary data code word in a second encoding operation. The result of the second encoding operation is a data code word that contains modified ECC redundancy symbols, each of which includes the truncation pattern, and the one or more pseudo redundancy symbols.

The table 34 in FIG. 2 essentially contains the "information" symbols from each of the ECC modifier code words discussed in the above-referenced patent application. In the encoding system 8 of FIG. 1, the information in the table 34 is encoded along with the ECC redundancy symbols, to produce the modified redundancy symbols in the encoder in a single, two-level encoding operation. Accordingly, using the system 8 eliminates the need to produce the preliminary data code word and the associated ECC modifier code word and/or to perform a second encoding operation. The encoding system 8 thus saves both time and gate count over the system that performs the two encoding operations. Further, it reduces the need for the large amounts of available buffer space that are otherwise necessary to hold the two code words that are involved in the second encoding operation.

The table 34 is arranged such that it includes i*(d−1) 10-bit symbols. These symbols are selected by the appropriate bits of each of the ECC symbols, which in the example are the two highest order bits. The selected symbols are then added in an adder 35, to produce the information symbol that is passed to the multiplexers 14 and 16.

Alternatively, the table 34 may contain the information symbols. This table includes $2^{i*(d-1)}$, or $2^6$, entries and does not require the adder 35. The table entries are addressed using the i selected bits from each of the d−1 ECC redundancy symbols. Generally, the smaller i*(d−1) entry table is used with the adder 35, to save storage space.

2. Encoding using (m+i+1)-bit symbols

As discussed in U.S. Pat. application Ser. No. 08/86,894 entitled Modified Reed-Solomon Error Correction System Using (w+i+1)-bit Representations Of Symbols Of GF($2^{w+i}$), the Galois Field ($2^{m+i}$) for selected values of m+i can be generated by an irreducible polynomial:

$$p(x)=x^{m+i}+x^{m+i-1} \ldots x^2+x+1.$$

In such Galois Fields the elements may be represented by a degree m+i polynomial, and each element is associated with two distinct but related (m+i+1)-bit symbols b(x) and c(x), where $$b(x)+c(x)=p(x).$$

The symbols b(x) and c(x) are complements and one of the symbols will have a lower weight, that is, have a smaller number of ones, than the other symbol.

One of the advantages of using the (m+i+1)-bit symbols in the encoder 10 is that multiplication of two (m+i+1)-bit symbols is performed by exclusive-OR'ing cyclically shifted copies of one symbol with the coefficients, or bits, of the other symbol. If a lower weight symbol is used in a constant multiplier, such as in multiplier 18, 20 or 22, the multiplier is easily implemented, with a minimum number of exclusive-OR gates. This is in contrast to multiplying two (m+i)-bit symbols, which typically requires many and more complex steps.

Figure 3:
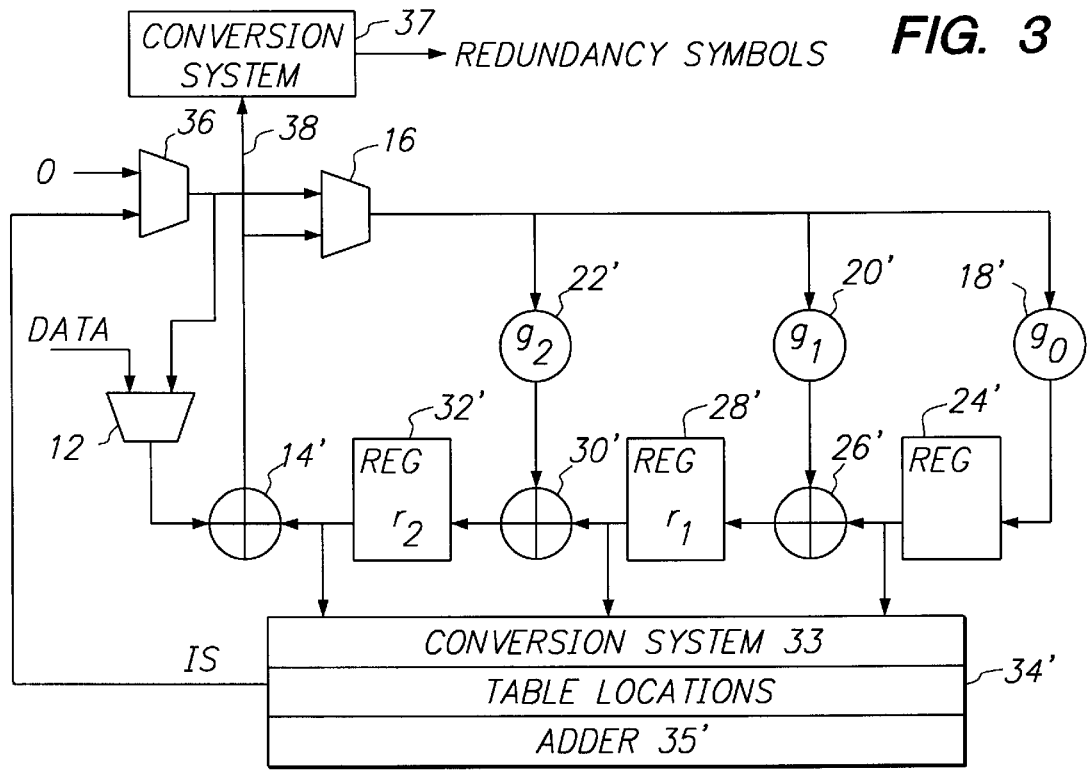
FIG. 3 is a functional block diagram of the encoding system of FIG. 1 that uses (m+i+1)-bit symbols.

Referring now to FIG. 3, the Galois Field multipliers 18', 20' and 22' are each (m+i+1)-bit, or in the example, 11-bit multipliers. Before encoding the 8-bit data symbols, i+1 or 3 bits are appended to the symbols. Two of these bits are set in the truncation pattern of 00 and a third higher order bit is set to a 0. These multipliers multiply 11-bit representations of the data symbols by the lower weight 11-bit representation of the generator polynomial coefficients $g_0$, $g_1$ and $g_2$, to produce in registers 24', 28' and 32' the 11-bit representations of the ECC redundancy symbols.

The selected i+1 or 3 bits of the ECC redundancy symbols are then used to enter the ECC modifier look-up table 34'. The table includes a conversion subsystem 33, which determines if the highest order selected bit in a given ECC redundancy symbol is a 0 or a 1. If the bit is a 0, the conversion subsystem uses the remaining two selected bits from the ECC symbol to address the table locations and retrieve from the table the information required to modify that symbol. If the highest order selected bit of the ECC symbol is a 1, the conversion subsystem complements the symbol and uses the remaining two selected (complemented) bits to address the table locations.

The information from the addressed table locations is then combined using an 11-bit adder 35', to produce an 11-bit information symbol. This information symbol is encoded with the 11-bit ECC redundancy symbols, in the manner discussed above, to both modify the 11-bit ECC redundancy symbols and append thereto an 11-bit pseudo redundancy symbol. The redundancy symbols each have their selected three bits set to the appropriate values and the bits are then truncated, to produce a set of 8-bit redundancy symbols.

As an example, we encode 11-bit data symbols in accordance with the generator polynomial $$x^3 + \alpha^{300} x^2 + \alpha^{365} x + \alpha^{195}$$

to produce three 11-bit ECC redundancy symbols. Before the data symbols are encoded, three selected bits are appended to the symbols. The selected bits are the three highest order bits, with the $11^{th}$ bit being set to zero and the $10^{th}$ and $9^{th}$ bits forming the truncation pattern of 00.

The multipliers 18', 20' and 22' multiply the 11-bit symbols by the lower weight 11-bit representations of the coefficients of the generator polynomial, and the adders 26' and 30' are 11-bit adders that add the products produced by the multipliers to the contents of the registers. The adder 14' is an 11-bit adder that adds the contents of register 32 to is the 11-bit symbols applied to the encoder. During the first level of encoding the sum produced by the adder 14' is fed back to the Galois Field multipliers through multiplexer 16.

After the 11-bit data symbols have been encoded, the three highest order bits of the 11-bit ECC symbols in the registers 32', 28', 24' are applied to the ECC modifier table 34'. In the example, the 11-bit ECC symbols are:

10101101011 in register 32'
01111101010 in register 28'
11111101111 in register 24' and the bits 101, 011 and 111 are applied to the conversion subsystem 33. The conversion subsystem complements the first set of three bits to 010 and the third set of three bits to 000, after determining that the highest order bit in both of these sets is set to a 1. The highest order bit in each set of bits is then ignored and the remaining two bits of each set are used to address the table locations.

The table contains six 11-bit symbols:

$r_5 = \alpha^{953}$
$r_4 = \alpha^{251}$
$r_3 = \alpha^{177}$
$r_2 = \alpha^{126}$
$r_1 = \alpha^{164}$
$r_0 = \alpha^{829}$ where $r_5$ and $r_4$ are associated with the ECC redundancy symbol in register 32', $r_3$ and $r_2$ are associated with the ECC redundancy symbol in register 28' and $r_1$ and $r_0$ are associated with the ECC redundancy symbol in register 24'. The symbols retrieved from the table are $r_5$, by the non-zero bit in the first set of bits, and $r_3$ and $r_2$ by the non-zero bits in the second set of bits. These symbols are then combined in the adder 33', to produce the information symbol, IS:

$$r_5 + r_3 + r_2 = \alpha^{953} + \alpha^{177} + \alpha^{126} = \alpha^{293}$$

which in binary form is 01011100100. This information symbol is then applied to the encoder through multiplexers 12 and 16. The information symbol is added to the contents of register 32', to produce the first modified ECC symbol $$10101101011 + 01011100100 = 11110001111$$

This symbol is removed from the encoder over line 38 and since its leading bit is a one it is complemented in an ECC conversion subsystem 37, to produce an 11-bit symbol 00001110000 that has its $11^{th}$ bit set to 0 and its $10^{th}$ and $9^{th}$ set in the truncation pattern.

The information symbol is also applied to the Galois Field multipliers through multiplexer 16. The products produced by the multipliers are added to the contents of the registers 28' and 24' and the sums used to update the registers 32' and 28'. The product produced by Galois Field multiplier 18' updates the register 24'. The registers then contain the 11-bit modified ECC redundancy symbols:

00011001010 in register 32'
11100011010 in register 28'
00001110010 in register 24'

These symbols are shifted out of the encoder 10, by applying to the encoder three all-zero symbols. The symbol 11100011010 is complemented in the converter subsystem is 37, to produce the symbol 00011100101, which has its highest order bit set to 0 and the next two bits set in the truncation pattern 00. The last symbol shifted out of the encoder is the pseudo redundancy symbol, which is appended to the modified ECC symbols that are, in turn, appended to the data symbols to form the data code word.

3. Encoding to Produce R>1 Pseudo Redundancy Symbols

Figure 4:
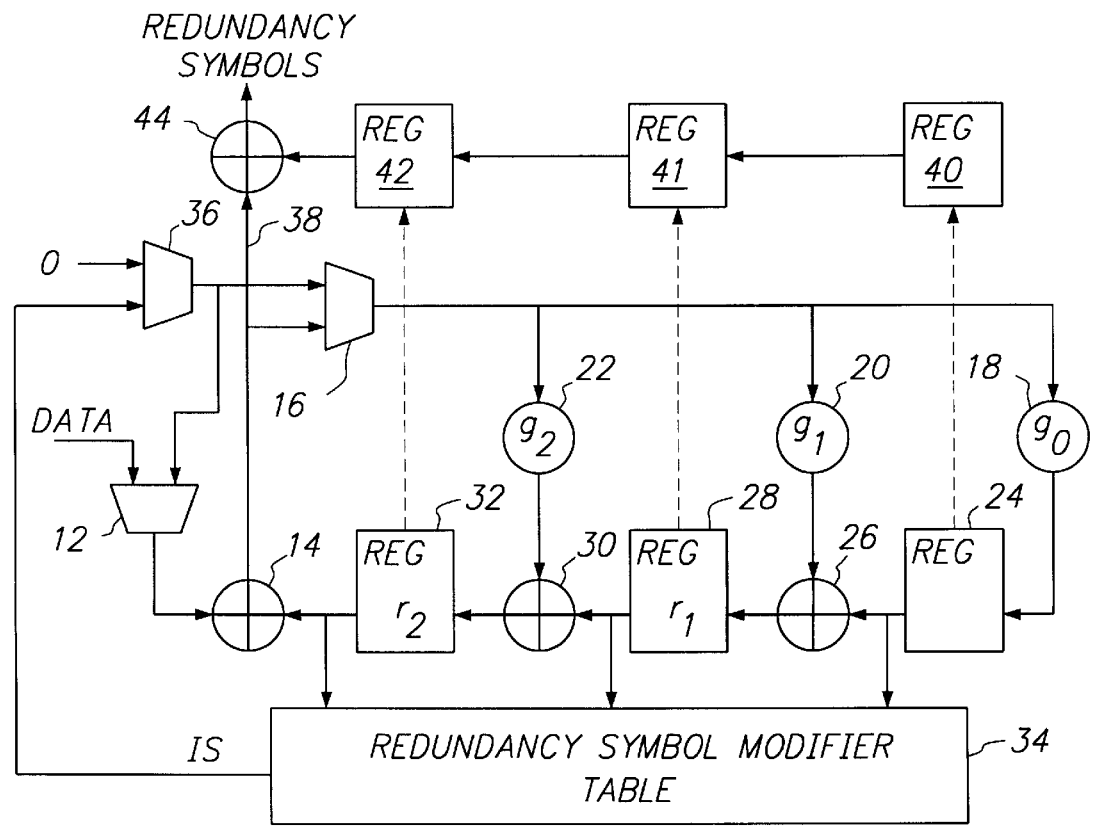
FIG. 4 is a functional block diagram of an encoding system that produces a plurality of pseudo redundancy symbols.

Referring now to FIG. 4, an encoding system 40 includes in an encoder 10" registers 24", 28" and 32," Galois Field multipliers 18", 20" and 22" and adders 14", 26" and 30" which are the same as the registers, multipliers and adders of either the encoding system of FIG. 1 or FIG. 3, depending on whether (m+i)-bit or (m+i+1)-bit symbols are used.

The encoder 10" encodes the m-bit data symbols in accordance with a generator polynomial g(x) in the same manner discussed above. The degree of the generator polynomial and the values of i and m) however, require more than one pseudo redundancy symbol, i.e., $$R = \left\lceil \frac{i * deg(g(x))}{m} \right\rceil > 1.$$

After the encoding of the data symbols, the registers 24", 28" and 32" contain the ECC redundancy symbols. These symbols are used to enter the table 34" and retrieve therefrom R information symbols IS1, IS2 . . . ISR. At the same time, the ECC redundancy symbols are stored in registers 40, 41 and 42, and the registers 32", 28" and 24" are then set to all zeros.

As an example, let R=2. During a first count, the first information symbol IS1 is supplied by the table 34" to the multiplexer 36. The multiplexer, in turn, supplies the information symbol IS1 to multiplexers 12 and 16. Multiplexer 12 supplies the symbol to the adder 14, which adds it to the all-zero contents of register 32." The sum, which is IS1, is then supplied to an adder 44.

The adder 44 adds the information symbol IS1 to the ECC redundancy symbol $r_2$ held in register 42, to produce a first modified redundancy symbol IS1+$r_2$. This modified symbol is then removed from the encoder. At the same time, the contents of registers 41 and 40 are shifted to update registers 42 and 41, respectively, and register 40 is set to all zeros. At the end of the first count the registers contains:

| REGISTERS: | 32 | 28 | 24 | 42 | 41 | 40 |
|---|---|---|---|---|---|---|
|  | 0 | 0 | 0 | $r_1$ | $r_0$ | 0 |

In a next count, the multiplexer 16 supplies the information symbol IS1 to the Galois Field multipliers 22", 20" and 18". The products produced by the Galois Field multipliers 20" and 22" are added to the (all-zero) contents of the registers 28" and 24" and the results are used to update the registers 32" and 28". The product produced by Galois Field multiplier 18" is used to update the register 24".

At the same time, a second information symbol IS2 is supplied by the table 34" to the multiplexer 36, which supplies the symbol, in sum, to the multiplexers 12 and 16. The multiplexer 12 supplies the symbol through adder 14 to the adder 44, which adds it to the ECC redundancy symbol $r_1$ held in register 42 to produce a second modified ECC redundancy symbol IS2+$r_1$. The modified ECC redundancy symbol is then removed from the encoder, and the registers 42–40 are updated. The contents of the registers at the end of the second count are:

| REGISTERS: | 32 | 28 | 24 | 42 | 41 | 40 |
|---|---|---|---|---|---|---|
|  | IS*$g_2$ | IS1*$g_1$ | IS1*$g_0$ | $r_0$ | 0 | 0 |

For the next count, the multiplexer 16 supplies the second information symbol IS2 to the Galois Field multipliers. The products produced by the multipliers 20" and 22" are added to the contents of registers 24" and 28", respectively, in adders 26 and 30. The sums are used to update the registers 32" and 28", and the product produced by multiplier 18" is used to update the register 24". The contents of the registers are thus:

| REGISTERS: | 32 | 28 | 24 | 42 | 41 | 40 |
|---|---|---|---|---|---|---|
|  | T*$g_2$+IS1*$g_1$ | T*$g_1$+IS1*$g_0$ | T*$g_0$ | 0 | 0 | 0 | where T=IS2+IS1*$g_2$

The system then applies an all-zero symbol to the multiplexer 36. This symbol is added to the contents of register 32" in the adder 14 and the sum is applied to the adder 44. The adder 44 adds the sum to the contents of register 42 to produce a third modified ECC symbol [(IS2+IS1*$g_2$)*$g_2$]+ IS1*$g_1$+$r_0$, and the modified symbol is removed from the encoder.

The registers 28 and 24 contain the two redundancy symbols. These symbols are then shifted out of the encoder by applying all zero symbols to the Galois Field multiplier through multiplexer 16.

The all-zero products produced by the multipliers are then added to the contents of the registers 24" and 28" and the sums are used respectively to update the registers 28" and 32". The register 24" is updated with the product from the multiplier 18. The contents of the registers are:

| REGISTERS: | 32 | 28 | 24 | 42 | 41 | 40 |
|---|---|---|---|---|---|---|
|  | T*$g_1$+IS1*$g_0$ | T*$g_0$ | 0 | 0 | 0 | 0 |

A next all-zero symbol is supplied by multiplexer 36 to multiplexer 12. The all-zero symbol is added to the updated contents of register 32" and the sum is supplied to adder 44. The adder 44 adds the symbol to the all-zero contents of register 42, and the sum T*$g_2$+IS1*$g_0$ is removed from the system as the first pseudo redundancy symbol.

The multiplexer 16 then supplies an all-zero symbol to the Galois Field multipliers and the products produced by multipliers 20" and 22" are added in adders 26 and 30 to the contents of the registers 24" and 28". The sums are then used to update the registers 28" and 32", respectively. The register 32 now contains the second pseudo redundancy T*$g_0$.

For the final count, a third all-zero symbol is supplied to the encoder through multiplexer 36, such that the symbol in the register 32", which is unchanged through adders 14 and 44, is removed from the encoder as the second of the pseudo redundancy symbols. The contents of the registers 32", 28" and 24" are then all updated to all zeros in preparation for the encoding of a next set of data symbols.

The two-level encoder, whether implemented with 10-bit or 11-bit multipliers and/or to produce one or a plurality of pseudo redundancy symbols, reduces gate count and eliminates the need for available buffer space for a preliminary data code word and an is ECC modifier code word that are required by systems that perform two or more encoding operations. The two-level encoding system thus also saves time by producing in a single encoding operation what other systems require multiple operations to produce, namely, a data code word encoded over $GF(2^{m+i})$ with m-bit symbols.

What is claimed is:

1. A two-level error correction encoder for encoding m-bit data symbols over $GF(2^{m+i})$ in accordance with a distance d error correction code, the encoder including:

A. d–1 Galois Field multipliers for multiplying symbols by m+i bit coefficients of a generator polynomial associated with the error correction code;

B. d–1 registers for holding remainder symbols;

C. d–2 adders for adding the symbols held in the registers to products produced by the Galois Field multipliers;

D. adding means for adding the symbol held in one of the registers to the symbol applied to the encoder;

E. first switching means for directing a sum produced by the adding means to a second switching means in response to a first control signal and in response to a second control signal directing the sum out of the encoder;

F. second switching means for directing the sum produced by the adding means to the Galois Field multipliers in response to a first control signal and in response to a second control signal directing an information symbol to the Galois Field multipliers; and G. a look-up table for storing information associated with a second level of encoding, the look-up table being addressed by selected bits of the symbols stored in the registers after the data symbols have been applied to the encoder, and producing in response to the selected bits one or more information symbols that are applied to the adding means and the second switching means.

2. The encoder of claim 1 wherein after the information symbol is encoded the d–1 registers contain a set of modified ECC redundancy symbols that have the selected bits set in a predetermined pattern.

3. The encoder of claim 1 wherein the look-up table includes an adder that combines the information in the table locations addressed by the selected bits.

4. The encoder of claim 1 further including
   H. a second set of registers for use in modifying the symbols held in the d−1 registers and producing a plurality of pseudo redundancy symbols; and
   I. a second adding means for adding to the contents of one of the registers in the second set of registers the information symbols retrieved from the lookup table.

5. A method of encoding m-bit data symbols over $GF(2^{m+i})$ using a distance d error correction code to produce redundancy symbols that each have i selected bits set in a predetermined pattern, the method including the steps of:
   A. appending i bits set in the predetermined pattern to the data symbols and encoding the m+i-bit data symbols in accordance with a generator polynomial to produce d−1 ECC redundancy symbols;
   B. using i selected bits from each of the d−1 ECC redundancy symbols to enter a lookup table to retrieve one or more information symbols associated with modifying the ECC redundancy symbols;
   C. encoding the one or more information symbols with the ECC redundancy symbols to produce
      a. d−1 modified ECC redundancy symbols that each have i selected bits set in the predetermined pattern, and
      b. R pseudo redundancy symbols that each have i selected bits set in the predetermined pattern; and
   D. forming a data code word that includes the m-bit data symbols and d−1+R m-bit redundancy symbols, by truncating from the ECC redundancy symbols and the pseudo redundancy symbols the i bits that are set in the predetermined pattern.

6. The method of claim 5 wherein the step of entering the lookup table includes:
   i. addressing table locations and retrieving information from the locations associated with the i selected bits from each ECC redundancy symbol that are not set in the predetermined pattern, and
   ii. combining the retrieved information to produce the one or more information symbols.

7. The encoder of claim 6 wherein the look-up table includes means for complementing the m+1+i bit symbols if the highest order selected bit is set to a particular value, the table using selected complemented bits to address the table locations.

8. The encoder of claim 7 wherein the look-up table includes an adder that combines the information in the table locations addressed by the selected bits.

9. The encoder of claim 5 further including
   H. a second set of registers for use in modifying the symbols held in the d−1 registers and producing a plurality of pseudo redundancy symbols; and
   I. a second adding means for adding to the contents of one of the registers in the second set of registers a symbol retrieved from the look-up table.

10. A two-level error correction encoder for encoding m-bit data symbols in accordance with a distance d error correction code over $GF(2^{m+i})$ using m+i+1 bit representation of the symbols in $GF(2^{m+i})$, the encoder including:
    A. d−1 Galois Field multipliers for multiplying symbols by m+i+1 bit representations of coefficients $g_{d-1}$, $g_{d-2}$, ..., $g_0$ of a generator polynomial associated with the error correction code;
    B. d−1 registers for holding m+i+1 bit remainder symbols;
    C. d−2 adders for adding the symbols held in the registers to products produced by the Galois Field multipliers;
    D. adding means for adding the symbol held in one of the registers to the symbol applied to the encoder;
    E. first switching means for directing a sum produced by the adding means to a second switching means in response to a first control signal and in response to a second control signal directing the sum out of the encoder;
    F. second switching means for directing the sum produced by the adding means to the Galois Field multipliers in response to a first control signal and in response to a second control signal directing an information symbol to the Galois Field multipliers; and
    G. a look-up table for storing information associated with a second level of encoding, the look-up table being addressed by selected bits of the symbols stored in the registers after the data symbols have been applied to the encoder, and producing in response to the selected bits the information symbol that is applied to the adding means and the second switching means.

11. The encoder of claim 10 wherein after the information symbol is encoded the d−1 registers contain a set of m+i+1 bit representations of modified ECC redundancy symbols that have the selected bits set in a predetermined pattern.

12. A method of encoding m-bit data symbols over $GF(2^{m+i})$, using a distance d error correction code and m+i+1 bit representations of the symbols of $GF(2^{m+i})$, to produce redundancy symbols that each have i+1 selected bits set in a predetermined pattern, the method including the steps of:
   A. appending i+1 bits set in the predetermined pattern to the data symbols and encoding the m+i+1 bit data symbols in accordance with a generator polynomial to produce d−1 ECC redundancy symbols;
   B. using i selected bits from each of the d−1 ECC redundancy symbols to enter a lookup table to retrieve one or more information symbols associated with modifying the ECC redundancy symbols;
   C. encoding the one or more information symbols with the ECC redundancy symbols to produce
      a. d−1 m+i+1 bit modified ECC redundancy symbols that each have i+1 selected bits set in the predetermined pattern, and
      b. R pseudo redundancy symbols that each have i+1 selected bits set in the predetermined pattern; and
   D. forming a data code word that includes the m-bit data symbols and d−1+R m-bit redundancy symbols, by truncating from the ECC redundancy symbols and the pseudo redundancy symbols the i+1 bits that are set in the predetermined pattern.

13. The method of claim 12 wherein the step of entering the lookup table includes:
   i. addressing table locations and retrieving information from the locations associated with the i of the selected i+1 bits from each ECC redundancy symbol that are not set in the predetermined pattern, and
   ii. combining the retrieved information to produce the one or more m+i+1 bit information symbols.

14. The method of claim 13 wherein the step of entering the lookup table further includes complementing i of the i+1 selected bits if the highest order bit of the i+1 bits is set to a particular value, and using I of the complemented bit to address the table locations.

15. A method of encoding m-bit data symbols over $GF(2^{m+i})$ using a distance d error correction code to produce redundancy symbols that each have i selected bits set in a predetermined pattern, the method including the steps of:

A. appending i bits set in the predetermined pattern to the data symbols and encoding the m+i-bit data symbols in accordance with a generator polynomial to produce d−1 ECC redundancy symbols;

B. using i selected bits from each of the d−1 ECC redundancy symbols to enter a lookup table to retrieve a plurality of information symbols associated with modifying the ECC redundancy symbols;

C. encoding the information symbols and the ECC symbols to produce
   a. d−1 modified ECC redundancy symbols that each have i selected bits set in the predetermined pattern, and
   b. R pseudo redundancy symbols that each have i selected bits set in the predetermined pattern; and E. forming a data code word that includes the m-bit data symbols and d−1+R m-bit redundancy symbols, by truncating from the d−1 modified ECC redundancy symbols and the R pseudo redundancy symbols the i bits that are set in the predetermined pattern.

16. The method of claim 15 wherein the step of entering the lookup table includes:

i. addressing table locations and retrieving information from the locations associated with the i selected bits from each ECC redundancy symbol that are not set in the predetermined pattern, and ii. combining the retrieved information to produce the one or more information symbols.

* * * * *